(12) United States Patent
Thorp et al.

(10) Patent No.: US 7,764,534 B2
(45) Date of Patent: Jul. 27, 2010

(54) TWO TERMINAL NONVOLATILE MEMORY USING GATE CONTROLLED DIODE ELEMENTS

(75) Inventors: Tyler J. Thorp, Sunnyvale, CA (US); Roy E. Scheuerlein, Cupertino, CA (US)

(73) Assignee: Sandisk 3D LLC, Milpitas, CA (US)

( * ) Notice: Subject to any disclaimer, the term of this patent is extended or adjusted under 35 U.S.C. 154(b) by 18 days.

(21) Appl. No.: 12/003,570

(22) Filed: Dec. 28, 2007

(65) Prior Publication Data

US 2009/0168492 A1 Jul. 2, 2009

(51) Int. Cl.
*G11C 11/00* (2006.01)

(52) U.S. Cl. .................... 365/148; 365/105

(58) Field of Classification Search ............... 365/148, 365/149, 171, 175, 113, 105
See application file for complete search history.

(56) References Cited

U.S. PATENT DOCUMENTS

| | | | |
|---|---|---|---|
| 4,037,243 A * | 7/1977 | Hoffman et al. ............ 365/182 |
| 5,812,441 A | 9/1998 | Manning |
| 5,915,167 A | 6/1999 | Leedy |
| 6,055,180 A | 4/2000 | Gudesen et al. |
| 6,834,008 B2 | 12/2004 | Rinerson et al. |
| 6,847,544 B1 | 1/2005 | Smith et al. |
| 6,873,543 B2 | 3/2005 | Smith et al. |
| 6,881,994 B2 | 4/2005 | Lee et al. |
| 6,999,366 B2 | 2/2006 | Perner et al. |
| 7,071,008 B2 | 7/2006 | Rinerson et al. |
| 7,081,377 B2 | 7/2006 | Cleeves |
| 7,157,782 B1 | 1/2007 | Shih |
| 7,172,840 B2 | 2/2007 | Chen |
| 7,176,064 B2 | 2/2007 | Herner |
| 7,224,013 B2 | 5/2007 | Herner et al. |
| 7,307,013 B2 | 12/2007 | Raghuram et al. |
| 7,486,537 B2 * | 2/2009 | Scheuerlein et al. ........ 365/148 |
| 2004/0245557 A1 * | 12/2004 | Seo et al. ..................... 257/298 |
| 2005/0001232 A1 * | 1/2005 | Bhattacharyya ............. 257/133 |
| 2005/0052915 A1 * | 3/2005 | Herner et al. ............... 365/202 |
| 2005/0221200 A1 | 10/2005 | Chen |
| 2005/0226067 A1 * | 10/2005 | Herner et al. ............... 365/201 |
| 2006/0250836 A1 | 11/2006 | Herner et al. |
| 2006/0250837 A1 | 11/2006 | Herner et al. |
| 2006/0273298 A1 | 12/2006 | Petti |
| 2007/0010100 A1 * | 1/2007 | Raghuram et al. .......... 438/710 |
| 2007/0029607 A1 * | 2/2007 | Kouznetzov ................. 257/321 |
| 2007/0072360 A1 | 3/2007 | Kumar et al. |
| 2007/0090425 A1 | 4/2007 | Kumar et al. |
| 2007/0114509 A1 * | 5/2007 | Herner ......................... 257/4 |
| 2007/0284656 A1 | 12/2007 | Radigan et al. |
| 2009/0034355 A1 * | 2/2009 | Wang ..................... 365/230.01 |

(Continued)

FOREIGN PATENT DOCUMENTS

WO  WO 2006/003620 A1  1/2006

OTHER PUBLICATIONS

U.S. Appl. No. 09/560,626, filed Apr. 28, 2000, Knall.

(Continued)

*Primary Examiner*—Gene N. Auduong
(74) *Attorney, Agent, or Firm*—Foley & Lardner LLP (57) ABSTRACT

A nonvolatile memory cell includes a gate controlled diode steering element and a resistivity switching element.

28 Claims, 5 Drawing Sheets

U.S. PATENT DOCUMENTS

2009/0168507 A1* 7/2009 Petti .................... 365/175

OTHER PUBLICATIONS

U.S. Appl. No. 09/819,077, filed Jun. 25, 2007, Kumar et al.
U.S. Appl. No. 11/819,562, filed Jun. 28, 2007, Meeks et al.
U.S. Appl. No. 11/819,618, filed Jun. 28, 2007, Kumar et al.
Baek, et al., "Multi-layer Cross-point Binary Oxide Resistive Memory (OxRRAM) for Post-NAND Storage Application", IEEE, 2005.
Beck, A. et al., "Reproducible Switching Effect in Thin Oxide Films for Memory Applications", Applied Physics Letters, vol. 77, No. 1, 2000, pp. 139-141.
Kim, et al., "Reversible Resistance Switching Behaviors of Pt/NiO/Pt Structures", Japanese Journal of Applied Physics, vol. 46, No. 8A, 2007, pp. 5205-5207.
Kun Ho Ahn, "Change of conduction mechanism by microstructural variation in Pt/(Ba, Sr)$TiO_3$/Pt film capacitors", Journal of Applied Physics, vol. 92 No. 1, 2002, pp. 421-425.
Lee et al., "Resistance Switching of the Nonstoichiometric Zirconium Oxide for Nonvolatile Memory Applications", IEEE Electron Device Letters, vol. 26, No. 9, 2005, pp. 719-721.
Sakamoto, et al., "Electronic transport in $Ta_2O_5$", Applied Physics Letters, vol. 91, 092110, 2007.
Sim, et al., "Resistance-Switching Characteristics of Polycrystalline $Nb_2O_5$ for Nonvolatile Memory Application", IEEE Electron Device Letters, vol. 26, No. 5, 2005, pp. 292-294.
Watanabe, Y., "Current-Driven Insulator-Conductor Transition and Nonvolatile Memory in Chromium-Doped $SrTiO_3$ Single Crystals", Applied Physics Letters, vol. 78, No. 23, 2001, pp. 3738-3740.

* cited by examiner

Leakage Path Along Selected Bit Line

Fig. 8

Integrated Control Gates

TWO TERMINAL NONVOLATILE MEMORY USING GATE CONTROLLED DIODE ELEMENTS

BACKGROUND

The invention generally relates to a semiconductor device, and more particularly, to a nonvolatile memory device containing a gate controlled diode.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

SUMMARY

A nonvolatile memory cell includes a gate controlled diode steering element and a resistivity switching element.

DETAILED DESCRIPTION OF THE EMBODIMENTS

The present inventors realized that the use of a gate controlled diode element in a two terminal nonvolatile memory cell provides a cell with a lower threshold voltage. Preferably, the gate controlled diode is used as a steering element (i.e., as an isolation element or switch) of the memory cell in conjunction with a resistivity switching element, such as a phase change material, fuse, antifuse, etc. The gate controlled diode allows the use of a resistivity switching material with a low breakdown voltage (such as voltage of 1V or less), control of programming of materials with low programming voltage activation, and the use of lower power programming and reading due to the removal or lowering of the diode threshold voltage with the application of a voltage to the gate.

As used herein, a gate controlled diode comprises a semiconductor device having a p-type semiconductor region and an n-type semiconductor region and gate electrode located adjacent to the diode. Preferably, an intrinsic (i-type) semiconductor region is located between the p-type and the n-type regions of the diode to form a p-i-n type diode. The gate controlled diode differs from a field effect transistor in that it lacks a channel region of the transistor. In other words, in a transistor, a channel of one conductivity type is located between source and drain regions of an opposite conductivity type to form either a p-n-p or an n-p-n structure in the semiconductor material. In contrast, in a gate controlled diode, the channel of one conductivity type is not present between source and drain regions of the opposite conductivity type. Instead, either a p-n or a p-i-n type structure is formed in the semiconductor material. The gate of the gate controlled diode preferably comprises an insulated type gate in which the conductive gate electrode is separated from the diode semiconductor material by a thin gate insulating layer, such as a gate silicon oxide region. However, a Schottky type gate which contacts the semiconductor material of the diode may also be used in some non-preferred embodiments.

Figure 1:
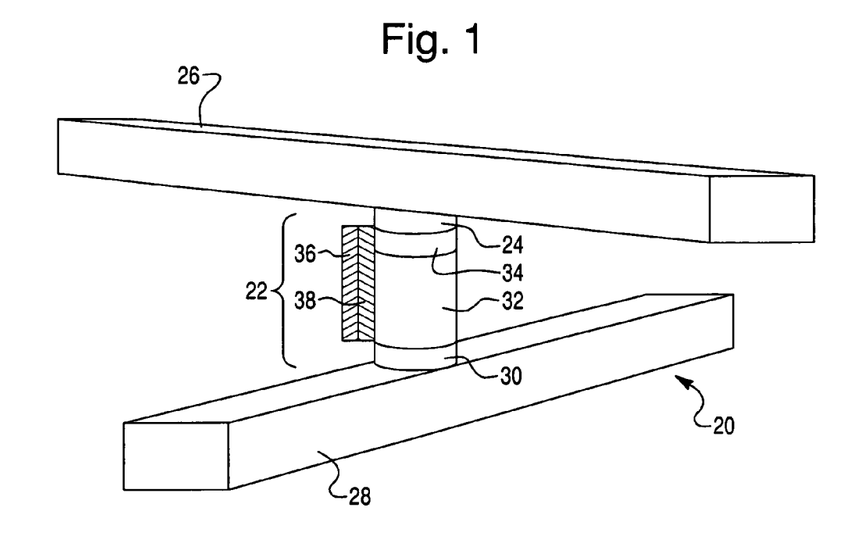
FIG. 1 is a perspective view of a nonvolatile memory cell of an embodiment of the invention.

In a preferred non-limiting embodiment, a plurality of pillar shaped devices which comprise a plurality of gate controlled diode containing nonvolatile memory cells are formed. However, the devices do not have to be pillar shaped and may extend horizontally with respect to a substrate. Referring to FIG. 1, one nonvolatile memory cell 20 includes a vertically oriented, preferably cylindrical pillar shaped gate controlled junction diode 22. Other diode shapes, such as rectangular or other polygonal cross section diode shapes may also be used. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material.

The cell 20 may be one-time programmable (OTP) or re-writable cell of various types. The diode 22 preferably acts as a steering element of the cell 20 (i.e., as a switch). The cell 20 preferably also contains a resistivity switching element 24. Examples of the resistivity switching element in the cell 20 include antifuse, fuse, polysilicon memory effect cell, metal oxide memory, switchable complex metal oxide, graphene layers, carbon nanotube memory, phase change material memory, conductive bridge element, or switchable polymer memory. The resistivity of the resistivity switching material 24 may be increased or decreased in response to a forward and/or reverse bias provided between the electrodes or conductors of the cell. In an alternative configuration, the diode itself may comprise both the steering and the resistivity switching elements. In this case, the cell may include only the gate controlled diode or the gate controlled diode in combination with a second resistivity switching element, such as the antifuse.

The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the resistivity switching element 24 are arranged in series between the bottom conductor 28 and the top conductor 26, which may be formed of a metal, such as tungsten and/or TiN. The resistivity switching element 24 may be located above or below the diode 22. The gate electrode 36 is preferably located at least adjacent to the intrinsic region 32, and preferably also adjacent to either the n-type 30 or the p-type 34 region of the diode. The gate electrode 36 can extend along the wordline or bitline direction, as will be described in more detail below. The gate electrode 36 may comprise any suitable conductor, such as aluminum, tungsten, heavily doped polysilicon, metal silicide, etc. The gate electrode 36 is preferably separated from the semiconductor regions 30, 32 and 34 by a gate insulating layer 38, such as silicon oxide, silicon nitride, etc., layer. When a voltage is applied to the control gate 36, this modifies the current-voltage (I-V) curves of the diode by lowering or removing the threshold voltage drop. The gate 36 may be located on one side of the diode 22 or it may surround all or part of the diode 22.

In one embodiment, the gated diode steering element 22 with a low threshold is used together in the cell 20 with a low breakdown memory material 24, such as phase change material(s) with less than 1 Volt breakdown. Non-gated diodes require an applied voltage of about 2 to 3 volts to read or program the cell at sufficient current levels. With the use of the gated diode 22, the bias for reading the array of memory cells 20 is reduced to less than 2V, such as about 1 to about 1.5 Volts. For programming the phase change material 24, the bias voltage is reduced to about 2 Volts or even less. In another embodiment the gated diode 22 is used with antifuse memory elements 24 at lower bias voltage because of the lower threshold switch to reduce power. In another embodiment a low threshold gated diode 22 controls the programming of materials 24 with low programming voltage activation, such as programmable metallization or fuse activated by less than 2 Volts, such as 0.3 to 0.8 Volts.

In an alternative embodiment, the resistivity switching material 24, such as an antifuse dielectric may be omitted. Instead, the polycrystalline semiconductor material of diode 22 is formed in a relatively high-resistivity state, which also tends to impede current flow, as described in a U.S. patent application Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage lowers the resistivity state of the diode. Thus, the diode acts as both a resistivity switching element and a steering element in this embodiment.

Figure 2A:
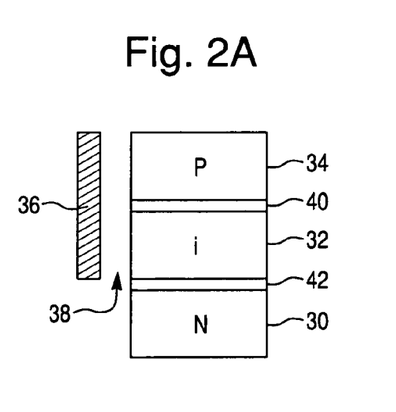
FIGS. 2A, 2B, 6 and 8 are side cross sectional views of nonvolatile memory cells of embodiments of the invention.
Figure 2B:
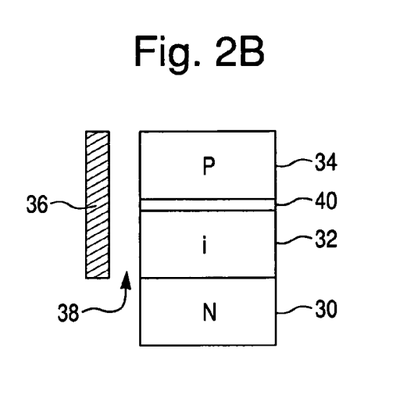

In another embodiment, the gate controlled diode 22 contains at least one tunneling dielectric layer 40, 42 located between an intrinsic semiconductor region and at least one of the p-type and the n-type semiconductor regions, as shown in FIGS. 2A and 2B. The tunneling dielectrics 40, 42 are thin dielectric layers, such as silicon oxide or silicon nitride layers, located between the n-type 30 and i-type 32 regions and/or between the p-type 34 and i-type 32 regions, to form a p-ox-i-ox-n structure shown in FIG. 2A. The dielectrics 40, 42 are thin enough to allow direct tunneling currents, having a thickness in the range of 0.5 nm to 3 nm. The leakage through the diode with tunneling dielectric layers is lower than through other p-i-n diodes because the tunneling probability to or from the intrinsic region 32 is very low. A voltage applied on a control gate adjacent to the intrinsic region modifies the tunneling probability of the p-ox-i-ox-n switch, thus lowering the threshold of the device. Other elements of FIGS. 2A and 2B are the same as in FIG. 1 as indicated by their identifying numerals.

Briefly, the cell 20 operates as follows. In the initial state, very little current flows through the junction diode 22 when a read voltage is applied between the top conductor 26 and the bottom conductor 28 because the material 24 impedes current flow. When a bias (i.e., voltage) is applied to the control gate 36, it lowers or eliminates the threshold of the diode 22 (and temporarily forms an inversion region or layer in the diode). The application of a programming voltage between the top conductor 26 and bottom conductor 28 (while a separate gate voltage (i.e., gate bias) is applied to the gate electrode 36) causes resistivity of material 24 to change to a lower state (for example by dielectric breakdown of an antifuse material 24, permanently forming a conductive path through the antifuse 24, or by changing the resistivity of the phase change material). If the diode semiconductor material is initially formed in a high resistivity state, then the semiconductor material of diode 22 may be altered as well, changing it to a lower-resistivity state. After programming, a higher read current flows between the top conductor 26 and the bottom conductor 28 upon application of a read voltage between the conductors 26 and 28. In this way, a programmed cell can be distinguished from an unprogrammed cell. Thus, the gate voltage is preferably applied to the gate during both the programming and the reading operations.

Figure 3:
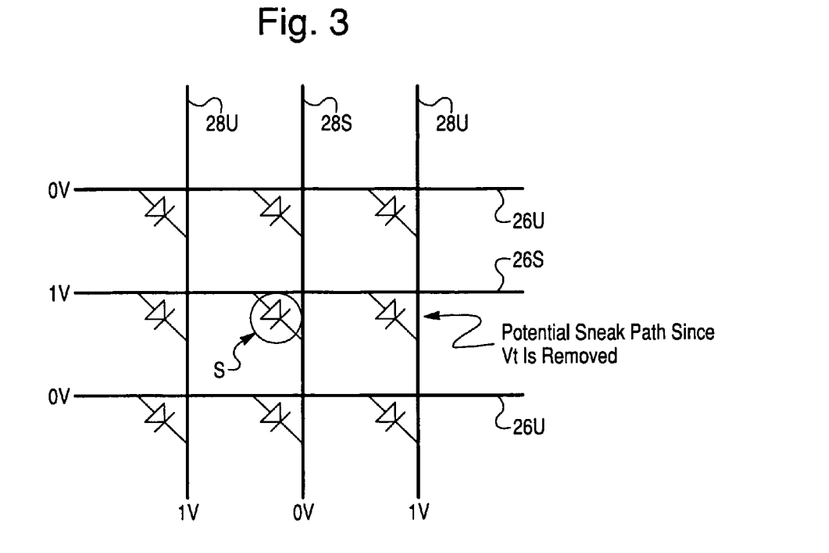
FIGS. 3 and 7 are partial circuit schematics of nonvolatile memory arrays of embodiments of the invention.
Figure 7:
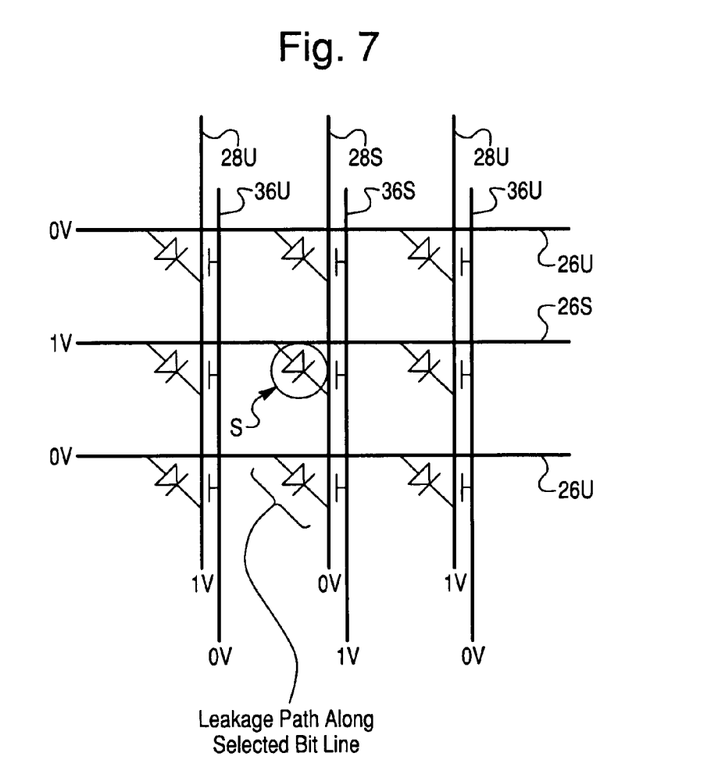

While the top conductor 26 will be referred to as a word line and the bottom conductor 28 will be referred to as a bit line herein, it should be noted that the designations may be reversed. As shown in FIG. 3, for example, to program a selected cell 20 in a cross point array of cells, 1V bias may be applied to the word line 26S of the selected cell S and 0V may be applied to the bit line 28S of the selected cell (to provide a forward bias to the selected cell), while 0V bias may be applied to the word lines 26U of the unselected cells and 1V may be applied to the bit lines of the unselected cells (to provide a reverse bias to the non-selected cells which do not share a common word or bit line with the selected cell). Other voltages may also be used. The gate lines 36 are omitted from FIG. 3 for clarity (but are shown in FIG. 7).

It order to avoid a leakage current path through adjacent non-selected cells which share a bit line or a word line with a selected cell (and are at 0V in FIG. 3), the voltage on the control gate 36 in unselected cells is applied at an intermediate bias between the bias on unselected word lines 26U and unselected bit lines 28U. This raises the threshold for the unselected cells and reduces the leakage current in the unselected cells. In the selected cell, the control gate is driven by a conductor parallel to either the bit line or word line. The control gate of the selected cell is set at a bias other then the intermediate bias to reduce the threshold of selected cell. Thus, the voltage is applied to the selected cell to increase the current through the selected cell while the non-selected cells remain in low leakage mode.

Preferably, a forward bias is applied to the selected cell to program the cell by decreasing the resistivity of the resistivity switching element 24. However, in alternative configurations, a reverse programming bias may also be applied instead of or in addition to the forward bias. Likewise, the resistivity state of certain resistivity switching elements 24, such as fuses for example, may be increased rather than decreased after programming. Furthermore multiple programming pulses may be used to form two or more reversible or one time programmable memory states. In general, programming and reading methods described in U.S. Published Applications 2006/0250836 and 2006/0250837 to Herner et al., which are incorporated by reference herein in their entirety, may be used.

Figure 4:
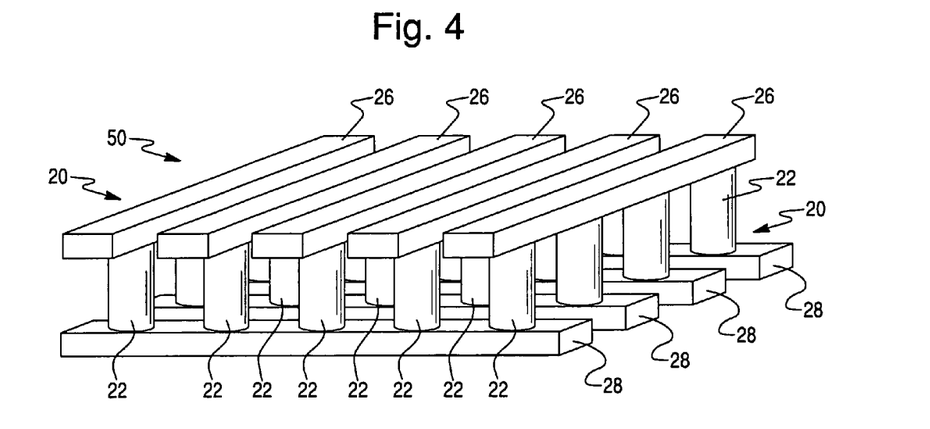
FIGS. 4 and 5 are perspective views of an array of memory cells of FIG. 1.
Figure 5:
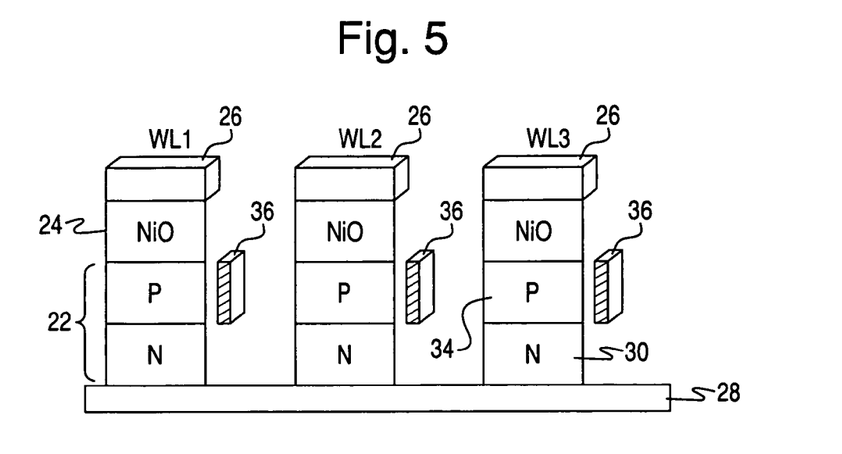

Referring to FIGS. 4 and 5, a portion of a first memory level 50 of memory cells 20 similar to the cell 20 of FIG. 1 is shown. The control gates 36 are omitted from FIG. 4 for clarity. FIG. 5 shows memory cells in which the control gates 36 extend in substantially the same direction as the word lines 26 and a metal oxide (such as nickel oxide) resistivity switching material 24 is used. In this configuration, the "half selected cells" (i.e., those that share a line with the selected cell) along a given bit line 28 are also in a low leakage mode and leakage currents on the bit line are reduced for better sensing margin.

Figure 6:
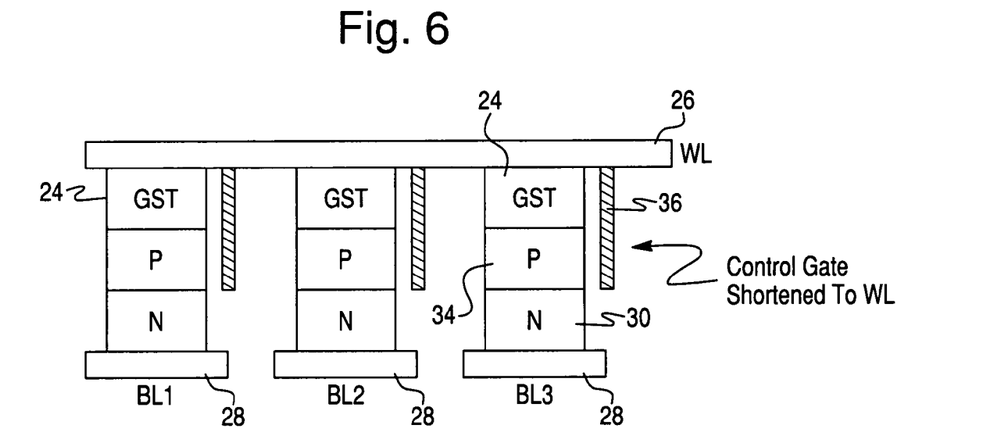

FIG. 6 shows an alternative embodiment of the invention, in which the control gate 36 is shorted to the word line 26. The threshold of the half selected cells along the selected bit line 28 is not reduced while the threshold of the selected cell is reduced. Higher programming currents in the selected cell are provided with the same or lower leakage currents in cells attached to unselected word lines.

FIG. 7 shows an alternative embodiment of the invention in which the control gates 36 extend parallel to the bit lines 28. In this configuration, the leakage path extends along the selected bit line 28S. As can be seen in FIG. 7, a 1V voltage is applied to the gate line 36S of the selected cell S, while 0V is applied to gate lines 36U of the unselected cells.

Figure 8:
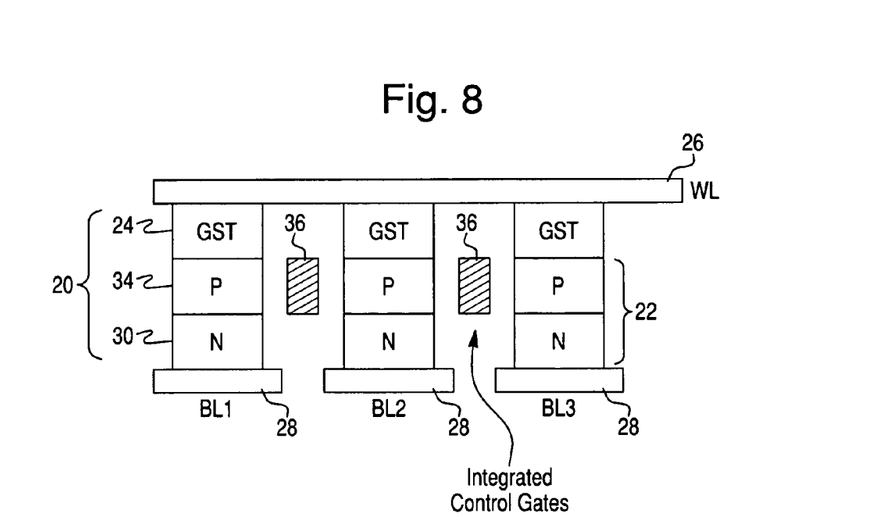

FIG. 8 shows an alternative embodiment of the invention in which the control gates 36 extend parallel to the bit lines 28 and the control gates 36 are shared between diodes 22 of adjacent cells 20. In this configuration, the gates 36 are interdigitated between the memory cell 20 pillars, to provide a structure similar to ENAND. In this configuration, a gate voltage creates an inversion region in both diodes 22 located adjacent to the gate 36.

Fabrication of a single memory level will be described in detail. Additional memory levels can be stacked, each monolithically formed above the one below it.

Figure 9A:
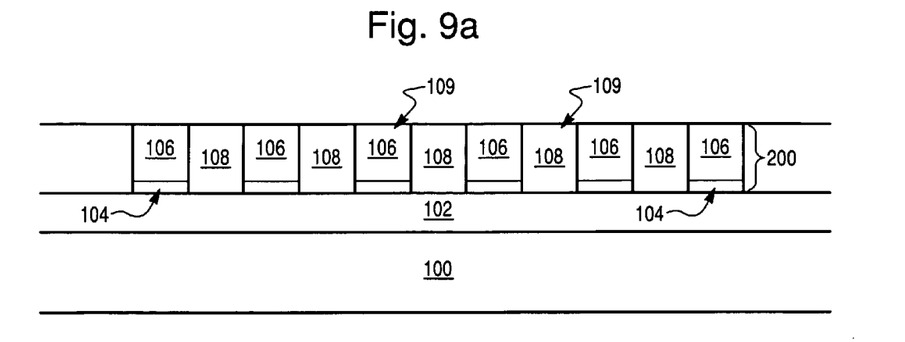
FIGS. 9a, 9b and 9c are side cross sectional views of nonvolatile memory cells of an embodiment of this invention at various steps in fabrication.

Turning to FIG. 9a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 (which correspond to the bit lines 28 in FIG. 1) are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 9a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 9a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 9B:
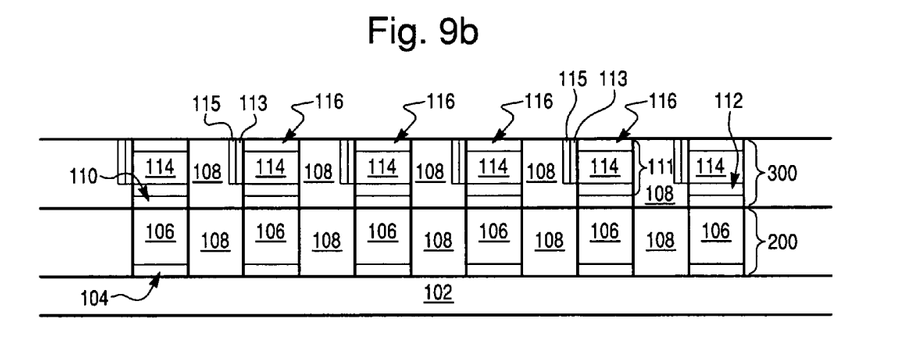

Next, turning to FIG. 9b, vertical pillars will be formed above completed conductor rails 200. (To save space substrate 100 is not shown in FIG. 9b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

In some embodiments a resistivity switching material layer or a sandwich of barrier layers, resistivity switching material layers, and other layers are deposited at location 110. For example a Titanium Nitride layer, Platinum layer, Nickel Oxide resistivity switching layer, and Second Titanium Nitride layer are deposited sequentially at location 110. Other resistivity switching materials would require other sequences of layers.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

Next, the gate controlled diodes are formed. Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3300 angstroms, preferably about 2000 angstroms.

Returning to FIG. 9b, semiconductor layers 114 and 112 just deposited, along with underlying barrier layer or multiple layer resistivity switching structure 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Then dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. The resulting structure is shown in FIG. 9b. In the diodes just formed, bottom heavily doped regions 112 are n-type while top heavily doped regions 116 are p-type; clearly the polarity could be reversed.

Trenches are formed in the dielectric material 108 by photolithographic patterning before or after forming regions 116. A gate insulating layer 113 layer is then formed adjacent to one or more sides of the pillars 300 in the trenches. The gate insulating layer 113 may comprise a silicon oxide formed by thermal oxidation of one or more sidewalls of the pillars 300 or by deposition of a silicon oxide and/or a silicon nitride layer adjacent to one or more sidewalls of the pillars 300. The control gate 115 is then formed adjacent to the gate insulating layer 113 in the trenches. The control gate may be formed by depositing a conductor, such as a metal or metal alloy (such as W, Al, Cu, metal silicide, etc.) or heavily doped polysilicon in the trenches and then planarized by CMP or etchback (i.e., the control gate 115 may be formed by a damascene process). This completes formation of diodes 111 (which correspond to gate controlled diodes 22 of FIG. 1).

Figure 9C:
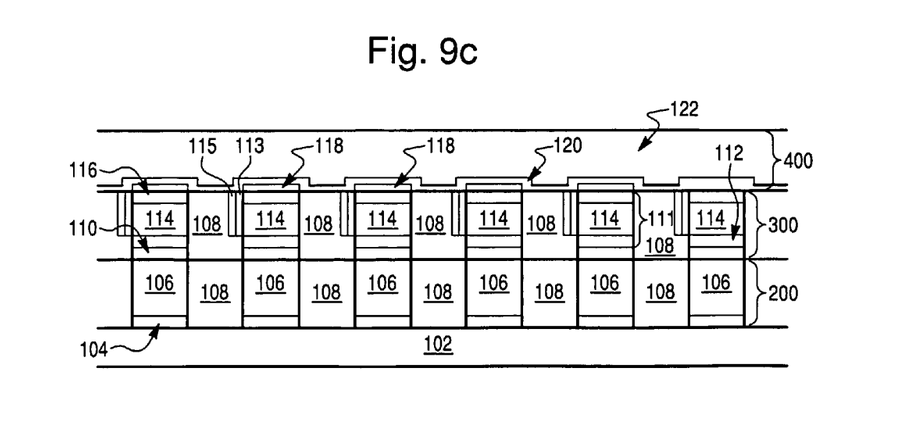

Turning to FIG. 9c, next a resistivity switching material 118, such as a dielectric rupture antifuse, a phase change material layer, etc., may be formed on top of each heavily doped region 116. Antifuse 118 is preferably a silicon dioxide layer formed by oxidizing the underlying silicon in a rapid thermal anneal, for example at about 600 degrees. Antifuse 118 may be about 20 angstroms thick. Alternatively, antifuse 118 can be deposited. If desired, the antifuse 118 may be omitted.

Top conductors 400 (which correspond to word lines 26 in FIG. 1) can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 9c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 9c, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A nonvolatile memory cell, comprising:
   a gate controlled diode steering element, wherein the gate controlled diode steering element comprises a substantially pillar shaped diode steering element; and
   a resistivity switching element electrically connected to the gate controlled diode steering element.

2. The cell of claim 1, wherein the gate controlled diode comprises a control gate located adjacent to at least one semiconductor region of the diode.

3. The cell of claim 2, wherein the gate is located adjacent to at least an intrinsic semiconductor region of a p-i-n gate controlled diode.

4. The cell of claim 2, wherein the gate controlled diode steering element and the resistivity switching element are arranged in series between a word line and a bit line.

5. The cell of claim 4, wherein the resistivity switching element comprises at least one of antifuse, fuse, polysilicon memory effect cell, metal oxide memory, switchable complex metal oxide, graphene layers, carbon nanotube memory, phase change material memory, conductive bridge element, or switchable polymer memory.

6. The cell of claim 4, wherein the control gate extends parallel to the word line.

7. The cell of claim 4, wherein the control gate extends parallel to the bit line.

8. The cell of claim 4, wherein the control gate is electrically connected to the word line.

9. The cell of claim 4, wherein the control gate is interdigitated between adjacent memory cells such that the control gate is located adjacent to the at least one semiconductor region of the diode and adjacent to at least one semiconductor region of a second diode of a second memory cell.

10. The cell of claim 1, wherein the gate controlled diode comprises both the steering element and the resistivity switching element of the memory cell.

11. The cell of claim 1, wherein the gate controlled diode contains at least one tunneling dielectric layer located between an intrinsic semiconductor region and at least one of a p-type and an n-type semiconductor regions.

12. The cell of claim 1, wherein the cell comprises a substantially pillar shaped cell in which the gate controlled diode steering element and the resistivity switching element comprise a pillar located over a first electrode and under a second electrode.

13. The cell of claim 1, wherein the cell is located in a monolithic three dimensional nonvolatile memory array.

14. A method of making a nonvolatile memory cell, comprising:
   forming a first conductor;
   forming a gate controlled diode steering element and a resistivity switching element over the first conductor; and
   forming a second conductor over the steering element and the resistivity switching element.

15. The method of claim 14, wherein:
   the first conductor comprises a bit line;
   the second conductor comprises a word line;
   the gate controlled diode comprises a control gate located adjacent to at least one semiconductor region of the diode; and
   the gate is located adjacent to at least an intrinsic semiconductor region of a p-i-n gate controlled diode.

16. The method of claim 15, wherein the resistivity switching element comprises at least one of antifuse, fuse, polysilicon memory effect cell, metal oxide memory, switchable complex metal oxide, graphene layers, carbon nanotube memory, phase change material memory, conductive bridge element, or switchable polymer memory.

17. The method of claim 15, wherein the control gate extends parallel to the word line or to the bit line.

18. The method of claim 15, wherein the control gate is electrically connected to the word line.

19. The method of claim 15, wherein the control gate is interdigitated between adjacent memory cells such that the control gate is located adjacent to the at least one semiconductor region of the diode and adjacent to at least one semiconductor region of a second diode of a second memory cell.

20. The method of claim 15, wherein the gate controlled diode contains at least one tunneling dielectric layer located between an intrinsic semiconductor region and at least one of a p-type and an n-type semiconductor regions.

21. A method of operating a nonvolatile memory cell array, comprising:
   providing the nonvolatile memory cell array, wherein each cell of the array comprises a gate controlled diode steering element in series with a resistivity switching element;
   applying a gate bias to the gate controlled diode of at least one selected cell of the array;
   applying an intermediate gate bias to the gate controlled diode of unselected cells of the array, the intermediate gate bias having a magnitude between a bias applied to unselected word lines and unselected bit lines associated with unselected cells in the array; and
   programming the at least one selected cell by applying a bias to the at least one selected cell.

22. The method of claim 21, wherein the step of programming comprises applying a forward bias between a word line and a bit line of the at least one selected cell while the gate bias is applied to the gate controlled diode of the at least one selected cell, to change a resistivity of the resistivity switching element of the at least one selected cell.

23. The method of claim 22, wherein the programming causes the resistivity of the resistivity switching element to be decreased.

24. The method of claim 22, further comprising applying a gate bias to the gate controlled diode of at least one selected cell, and applying a reading voltage to the at least one selected cell to read the at least one selected cell.

25. A nonvolatile memory cell, comprising:
   a gate controlled pn diode steering element, wherein the diode steering element comprises a p-type semiconductor and a n-type semiconductor; and
   a resistivity switching element electrically connected to the gate controlled pn diode steering element.

26. The cell of claim 25, wherein a junction between the p-type semiconductor and the n-type semiconductor comprises a tunneling dielectric layer.

27. A nonvolatile memory cell, comprising:
- a gate controlled p-i-n diode steering element, wherein a junction between a first semiconductor of the p-i-n diode steering element and a second semiconductor of the p-i-n diode steering element comprises a tunneling dielectric layer; and
- a resistivity switching element electrically connected to the gate controlled p-i-n diode steering element.

28. The cell of claim 27, wherein a second junction between the second semiconductor of the p-i-n diode steering element and a third semiconductor of the p-i-n diode steering element comprises a second tunneling dielectric layer.

* * * * *